United States Patent [19]
Batt

[11] Patent Number: 4,611,116
[45] Date of Patent: Sep. 9, 1986

[54] LIGHT EMITTING DIODE INTENSITY TESTER

[76] Inventor: James E. Batt, 292 Jomar Rd., Ardmore, Ala. 35739

[21] Appl. No.: 582,209

[22] Filed: Feb. 21, 1984

[51] Int. Cl.[4] ............................................. H01J 5/02
[52] U.S. Cl. .............................. 250/239; 324/158 D
[58] Field of Search ............. 356/236, 230, 231, 218, 356/220–228; 324/158 D, 158 F; 250/239, 551, 228, 215

[56] References Cited

U.S. PATENT DOCUMENTS

| | | | |
|---|---|---|---|
| 2,933,010 | 4/1960 | Vlahos | 356/231 |
| 3,617,757 | 11/1971 | Burr et al. | 250/239 |
| 3,826,574 | 7/1974 | Brown | 356/236 |

FOREIGN PATENT DOCUMENTS 153480  9/1982  Japan .

Primary Examiner—David C. Nelms
Attorney, Agent, or Firm—Anthony T. Lane; Robert P. Gibson; Robert C. Sims

[57] ABSTRACT

A device that tests the output intensity of light emitting diodes. The light emitting diode to be tested is placed in a light tight tube in which is placed a photocell. The photocell is placed so as to be in contact with the diode. When power is applied to the diode by means of a direct current source, the diode emits light which strikes the photocell. This output light changes the output resistance of the photocell and is measured by a testing circuit to see if the signal strength falls in an acceptable range.

3 Claims, 3 Drawing Figures

LIGHT EMITTING DIODE INTENSITY TESTER

DEDICATORY CLAUSE

The invention described herein may be manufactured, used, and licensed by or for the Government for governmental purposes without the payment to me of any royalties thereon.

BACKGROUND OF THE INVENTION

Output intensity of light emitting diodes (LED's) is critical when they are used to provide timing marks during exposure of film, as in high speed photography. Light output of LED's varies and it is imperative that the light actually be within an acceptable range for proper film exposure. If the light output is too weak or too strong the exposure is unacceptable.

In film recording of important events that require time encoding, all of the data recorded has value which must be related to the start of the event. This is especially true, for example, in determining when a malfunction occured and what may have caused it. Thus, for example, at launches of a projectile where the launch and flight are being recorded at high speed, the film in addition to recording the event, also has projected onto one or both edges of the film timing light pulses which are captured by the film. If the light is too bright it will blur and not give an accurate reference center and can even affect the desired exposure of the event. If the light is too weak it will not record the timing. These situations result in wasted time, effort, film and there will be no data captured respecting the launched projectile.

In preliminary evaluation of light emitting diodes used for providing timing pulses, testing procedures in use rely only on an observer viewing the diode to observe whether or not it appears to be reasonably bright. There are no actual measurements made of the light output. At present no measuring device indicating light output on timing LED's is readily available.

SUMMARY OF THE INVENTION

A device that tests the output intensity of light emitting diodes. The light emitting diode to be tested is placed in a light tight tube in which is placed a photocell so that the light emitting diode is in contact with the photocell. When power is applied to the diode by means of a direct current source, the diode emits light which strikes the photocell. This output light changes the resistance of the photocell and is measured by a testing circuit to see if the signal strength falls in an acceptable range.

DESCRIPTION OF THE PREFERRED EMBODIMENT

Figure 1:
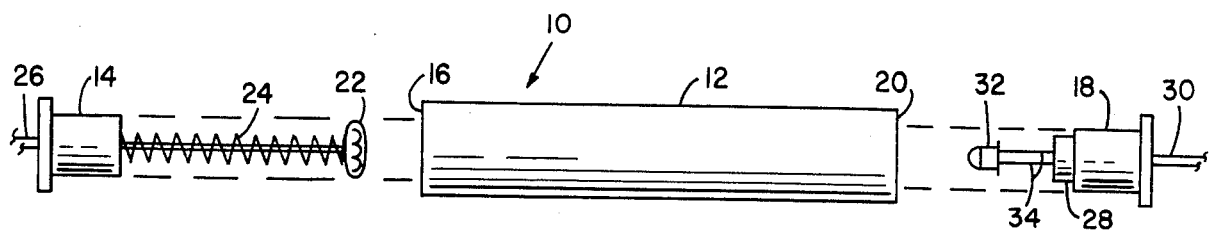
FIG. 1 is a drawing of a preferred embodiment of the light type tube assembly in an exploded view.

Referring now to the drawings wherein like numbers represent like parts, FIG. 1 is a drawing of a tube assembly 10. The tube assembly 10 comprises a light tight tube 12 having a plug 14 for sealing an end 16 of the tube and a plug 18 for sealing the other end 20 of the tube against external light penetration of the tube. The two plugs and the tube are disposed in relatively coaxial alignment. Plug 14 has a photocell 22 moveably supported on a spring 24 for placement of the photocell within tube 12. Electrical wires 26 pass through the spring and plug assembly to couple output signals from the photocell to testing circuitry. Plug 18 has a socket 28 mounted therein for placement within tube 12. Wires 30 pass through the plug assembly to the socket for applying a voltage or current input to the socket. Socket 28 is disposed for receiving a light emitting diode (LED) for testing. The leads of light emitting diodes are inherently nonuniform in length. Thus the position of an LED 32 in the tube depends on the length of the leads 34 and their depth of penetration into socket 28. Therefore, when assembled with an LED 32 installed, the spring loaded photocell is placed in actual contact with the light emitting surface of the diode, assuring that light always travels the same distance from the diode to the photocell.

Figure 2:
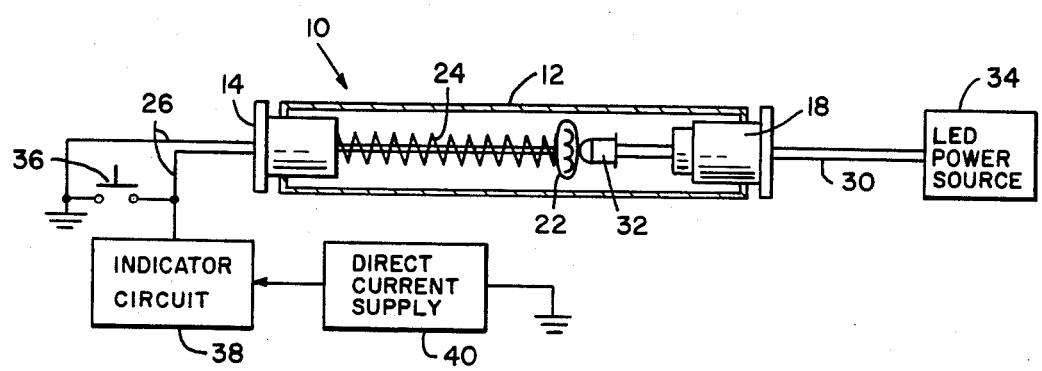
FIG. 2 is a drawing of the tube assembly of FIG. 1 showing the assembled light tube and associated testing circuitry.

Referring now to FIG. 2 which is a drawing of the tube assembly 10, in an operational circuit assembly, a LED power supply 34 has an output coupled through leads 30 for driving a diode 32. The resulting electrical signal output from photocell 22 is coupled as an input to an indicator circuit 38 which is further coupled to a direct current supply 40. A current path is thus developed from supply 40 through indicator circuit 38 and photocell 22 back to the supply 40 by way of a circuit common or ground. The resistance of the photocell varies with the intensity of light impinging thereon, changing the total resistance of the circuit an amount proportional to the degree of light output of the diode. Push button switch 36 is coupled across the output leads 26 from photocell 22 for momentarily placing a short circuit across the indicator circuit and direct current supply for nulling or calibrating the indicator circuit prior to testing of LEDs.

Figure 3:
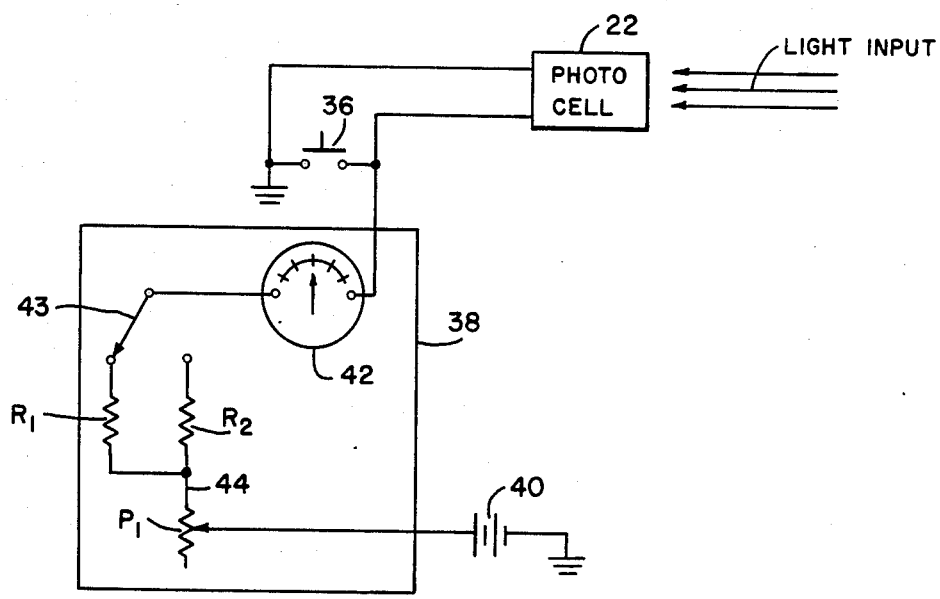
FIG. 3 is a typical schematic of a testing circuit for use with the embodiment of FIG. 2.

Referring now to FIG. 3 which is a typical indicator circuit disposed to receive an input from the photocell. The indicator circuit comprises a meter 42 coupled to a switch 43 which provides for connection through a resistor $R_1$ or a resistor $R_2$. Resistors $R_1$ and $R_2$ are connected on the other side through electrical lead 44 to potentiometer $P_1$ which is coupled to the direct current supply 40.

In operation the diode 32 and the photocell 22 are placed in the light tight tube 12. Spring 24 provides for direct contact between the diode and the photocell. When power is applied to the diode 32 it causes the diode to emit light. The light that is emitted from the diode strikes the photocell 22 and changes the resistance in the photocell. This change is measured by meter 42. Typically, meter 42 may be an $R \times 100,000$ ohmmeter and including R times other multiples of 10 as is well known in the art.

Push button switch 36 in conjunction with $P_1$ provide a null or zero adjust capability to assure that the meter reading is always accurate. When the push button is depressed the direct current supply is coupled through $P_1$, $R_1$ or $R_2$, meter 42 and the switch back to the direct current supply through a circuit common or ground. Adjusting $P_1$ while the push button is depressed allows current from direct current supply 40 to flow through meter 42. Changing the position of $P_1$ adjusts the current flow and the reading on meter 42. Then meter 42 can be adjusted to the desired reference point prior to use, thereby assuring that gradual changes in the current supply or other circuit elements do not cause an erroneous reading.

Typically, meter 42 may be utilized to indicate simply that the LED output is in the desired range. For this simple mode only the resistor $R_1$ and the potentiometer $P_1$ are needed. The additional resistor $R_2$ may be used, if desired, to provide a more accurate center-scale reading.

Thus, where meter 42 is adjusted to indicate acceptable output energy with a high scale reading, $R_2$ may be selected to reduce this scale reading to mid scale and more precisely indicate the output, thereby eliminating inherent high scale error. This is routine construction for volt-ampere-ohmmeters and is typically identified by an $R \times 1000$ or $R \times 100,000$ position switch on the ohmmeter circuit of meter 42.

Thus the light tight tube and related testing circuitry allows LED's to be tested for compliance within standard, predetermined acceptable minimum and maximum limits of operation prior to actually being placed in an operational environment. Standard minimum and maximum limits will obviously vary depending on the spacing of the LED's from the film in particular cameras, since light impinging on the film decreases with distance from the film. Standards may be initially set by several methods. A typical trial and error method is to use several LED's having a range of output intensity to expose a few frames of film and observe the acceptable timing marks. Upper and lower limits may readily be established in this way and then marked on the meter.

Although a particular embodiment and form of the invention has been described, it will be obvious to those skilled in the art that modifications may be made without departing from the scope and spirit of the foregoing disclosure.

I claim:

1. In a system for measuring pulses of electromagnetic radiation wherein detected radiation is indicated on a meter and is indicative of the strength of the detected radiation, the improvement of a radiation containment assembly comprising; a radiation containment housing containing a chamber open at first and second ends, first and second plugs for closing respective ends of said chamber, optical detector means supported by said first plug within the chamber, electrical wires coupled to said detector and passing through the first plug for coupling a signal output from said housing in response to optical stimulation of said detector means, said second plug having electrical wires passing therethrough for coupling an electrical signal input to said plug, said second plug being disposed for receiving and positioning an electromagnetic radiation emitter within said chamber, said first and second plugs provide for physical contact between said photocell and said radiation emitter within said chamber, a spring disposed on said second plug for holding said detector, whereby said optical detector is spring loaded within said chamber for allowing variable positioning of said detector within the chamber.

2. A system as set forth in claim 1 wherein said optical detector means is a photocell.

3. A system as set forth in claim 2 wherein said housing is a cylindrical light tight tube.

* * * * *